US006261726B1

(12) United States Patent
Brooks et al.

(10) Patent No.: US 6,261,726 B1
(45) Date of Patent: Jul. 17, 2001

(54) PROJECTION ELECTRON-BEAM LITHOGRAPHY MASKS USING ADVANCED MATERIALS AND MEMBRANE SIZE

(75) Inventors: Cameron J. Brooks, South Burlington; Michael J. Lercel, Williston; Lynn A. Powers, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/455,570

(22) Filed: Dec. 6, 1999

(51) Int. Cl.[7] ............... G03F 9/00; G03C 5/00; G21G 5/00

(52) U.S. Cl. ............... 430/5; 430/296; 250/492.2
(58) Field of Search ............... 430/5, 296; 378/34, 378/35; 250/492.2, 492.22

(56) References Cited

U.S. PATENT DOCUMENTS

| 4,260,670 | 4/1981 | Burns ............... 430/5 |
| 4,436,797 | 3/1984 | Brady et al. ............... 430/5 |

(List continued on next page.)

FOREIGN PATENT DOCUMENTS

| 5-062888 | 3/1993 | (JP) . |
| 5-062889 | 3/1993 | (JP) . |
| 10-198024 | 7/1998 | (JP) . |
| 10-199802 | 7/1998 | (JP) . |

OTHER PUBLICATIONS

G. Coleman and R. A. McCorkle—Ultra–Soft X–Ray Lithography, IBM Technical Disclosure Bulletin, vol. 24, No. 11B, Apr. 1982, p. 5804.

R. C. Farrow et al, Bell Laboratories/Lucent Technologies; J. Unruh and F. Qian, Photronics; M. Smith, Dupont Photomask; Commercialization of SCALPEL Masks, J. Vac. Sci. Technol. B 16(6), Nov./Dec. 1998, pp. 3582–3586.

Firooz N. Faili et al., Advanced Refractory Technologies, Inc.; Cameron J. Brooks et al. IBM Microelectronics Div., CVD Diamond Technology for NGL Mask Membrane to be presented at Applied Diamond Conference/Frontier Carbon Technology, Aug. 31–Sep. 3, 1999, Tsukuba, Japan.

M. M. Mkrtchyan et al., Lucent Technologies; Electron Scattering and Transmission Through SCALPEL Masks, J. Vac. Sci. Technol. B. 16(6), Nov./Dec. 1998, pp. 3385–3391.

*Primary Examiner*—S. Rosasco
(74) *Attorney, Agent, or Firm*—DeLio & Peterson, LLC; Peter W. Peterson; Richard M. Kotulak

(57) ABSTRACT

A stencil or scatterer mask for use with charged particle beam lithography such as projection electron-beam lithography comprises a membrane layer of a material having a Young's modulus of at least about 400 GPa and support struts supporting a surface of the membrane. The struts form and surrounding a plurality of discrete membrane areas of different aspect ratios aligned to design regions of an integrated circuit. The discrete membrane areas have different aspect ratios range from about 1:1 to about 12:1, and the discrete membrane areas have different size surface areas. The membrane is preferably silicon carbide, diamond, diamond-like carbon, amorphous carbon, carbon nitride or boron nitride. When used in scatterer masks, the ratio of discrete membrane area to membrane thickness is at least about $0.18 \text{ mm}^2/\text{nm}$. When used in stencil masks, the ratio of discrete membrane area to membrane thickness is at least about $1.0 \text{ mm}^2/\text{nm}$. The stencil mask is made by depositing a diamond membrane film patterned with a hardmask layer on a substrate, depositing an etch stop layer adjacent the diamond film, and forming supporting struts surrounding a plurality of discrete areas of the membrane film. The method then includes depositing a pattern over the membrane film within the discrete membrane film areas, the pattern conforming to one or more desired circuit elements, and etching the membrane film with a reactive ion etch containing oxygen to form openings in the membrane film.

25 Claims, 5 Drawing Sheets

U.S. PATENT DOCUMENTS

| | | | |
|---|---|---|---|
| 5,111,491 | 5/1992 | Imai et al. | 378/35 |
| 5,166,962 | 11/1992 | Murooka et al. | 378/34 |
| 5,260,151 | 11/1993 | Berger et al. | 430/396 |
| 5,674,413 | 10/1997 | Pfeiffer et al. | 219/121.25 |
| 5,728,492 | 3/1998 | Kawata | 430/5 |
| 5,781,607 | 7/1998 | Acosta et al. | 378/34 |
| 5,876,881 | 3/1999 | Kawata | 430/5 |
| 5,882,826 | 3/1999 | Kato et al. | 430/5 |
| 5,899,728 | 5/1999 | Mangat et al. | 438/459 |
| 5,912,095 | 6/1999 | Katakura | 430/5 |
| 5,942,760 | 8/1999 | Thompson et al. | 250/492.2 |
| 6,140,020 * | 10/2000 | Cummings | 430/5 |

* cited by examiner

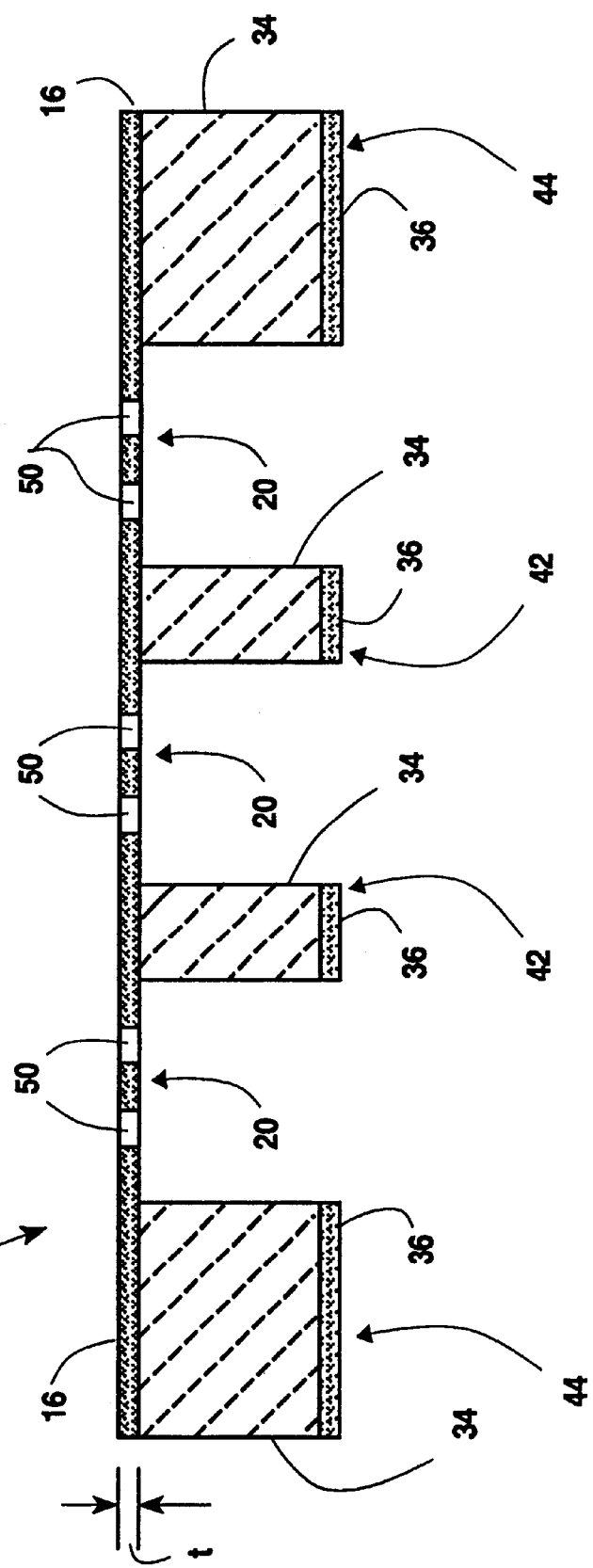

PROJECTION ELECTRON-BEAM LITHOGRAPHY MASKS USING ADVANCED MATERIALS AND MEMBRANE SIZE

BACKGROUND OF THE INVENTION

1. Field of the Invention

The present invention relates to masks used in photolithography of integrated circuit designs, and in particular, masks used in ray or charged particle beam lithography.

2. Description of Related Art

One of the most critical parameters of masks fabricated for advanced photolithography of integrated circuit designs is image placement error. This is particularly important for membrane masks such as those used in x-ray or charged particle beam lithography such as ion beam and, in particular, projection electron-beam lithography (PEBL). An embodiment of PEBL is referred to as the SCALPEL™ (scattering angular limited projection electron lithography) process. Projection electron-beam lithography requires masks that are at least semi-transparent to electrons. For this reason, these masks contain membranes that are very thin, on the order of 50–200 nm.

An example of the well-known PEBL lithography is shown in FIG. 1. Electron beam radiation 30 passes through a portion of mask 18 comprising a membrane layer 20 on which are deposited scatterer layer segments conforming to the circuit image to be projected. The electron beam 30 portion that passes with relatively low scatter through the membrane 20 portion between scatterer segments 22 is illustrated by beam 30a. Beam 30a is focused by lens system 24 and through an opening in back focal plane filter 26 onto the surface 32 of a semiconductor wafer having conventional resist materials sensitive to the electron beam radiation. Electron beam portion 30b which is scattered to a greater degree by scatterer segments 22 is somewhat focused by lens 24 but does not pass fully through the opening in filter 26. Thus, a contrasting image 28 is formed on wafer resist surface 32 which conforms to the pattern of scatterer layer 22 on the mask.

These lithography masks have to be robust, resistant to breakage and strong enough to minimize any in-plane distorting forces that occur as a result of processing. To minimize membrane breakage, the mask structure includes supporting struts which subdivide the membrane into areas of equal size and aspect ratio. It is within these uniform membrane areas that the radiation-absorbing scatterer or patterning layers must be formed to project the configuration of the individual circuit features or elements onto the different chip layers.

The format for a typical PEBL or SCALPEL™ mask is shown in FIGS. 2 and 3. The mask consists of a patterned scatterer layer 22 on top of a thin membrane material 16 of thickness t. In the side view shown in FIG. 2, membrane 16 covers essentially all the upper surface of mask 18. Typical scatterer layer materials include W, Cr/W, TaSi, Cr/TaSi, and combinations with other Ta-based compounds. Because the membrane is so thin, silicon struts are needed to reinforce the membrane, and strengthen the mask structure. The underlying support is formed from silicon layer 34 and protective layer 36, and openings are etched therein to form equi-spaced supporting struts 42 in a uniform pattern within outer supports 44. On a typical PEBL mask, there will be many membranes interlaced with struts in an arrangement similar to the one shown in FIG. 2. It is between struts 42 that the individual scatterer layers form patterns 22 corresponding to circuit features or elements on membrane areas 20. Each membrane area 20 needs to be small enough so that it is self-supporting, and any distortions due to patterning the scatterer layer are minimized. As shown in the bottom view in FIG. 3, the membrane areas 20 in the openings between struts 42 which contain the mask features have uniform size and aspect ratio. A typical size of the discrete membrane areas over the entire mask is about 12 mm$^2$ with a typical aspect ratio of 12:1 (width:length) as seen in plan view, or about 1 mm$^2$ with an aspect ratio of 1:1, again over the entire mask.

Alternatively, in stencil masks used for ion beam lithography or other configuration of electron beam lithography, the membrane material is used as the radiation absorber and openings which permit radiation passage are made which conform to the configuration of the individual circuit elements. In either case, the circuit design is subject to the size and aspect ratio of the uniform membrane areas on the mask.

Typical prior art membrane thicknesses and discrete membrane areas for various photolithography mask technologies are shown below in Table 1:

TABLE 1

| Mask Technology | Membrane Thickness (nm) | Discrete Membrane Area (mm$^2$) | Area/Thickness (mm$^2$/nm) |
|---|---|---|---|
| SCALPEL ™ | 150 | 13 | 0.09 |
| PEBL stencil | 1500 | 1 | 0.001 |
| IPL stencil | 3,000 | 2,500 | 0.83 |
| X-ray | 2,000 | 750 | 0.38 |

Bearing in mind the problems and deficiencies of the prior art, it is therefore an object of the present invention to provide an improved mask for use in ion beam and/or projection electron beam lithography.

It is another object of the present invention to provide such a lithography mask which is stronger and more robust than prior art masks.

A further object of the invention is to provide such a lithography mask which may be used for complex circuit patterns without limiting strength.

It is yet another object of the present invention to provide masks for the aforementioned uses which do not have prior restrictions on membrane opening size or aspect ratio.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a mask for photolithographic transfer of an image corresponding to an integrated circuit from the mask onto a semiconductor substrate comprising a patterned scattering or absorbing layer on a top surface of a partially energy transparent membrane in an inner region of the membrane; a peripheral support ring supporting an outer region of the membrane; and support struts supporting the inner region of the membrane, the struts connected to the support ring and aligned to major design elements of the integrated circuit. Preferably, the membrane is formed of a material having a Young's modulus of at least about 400 GPa, and the membrane comprises material selected from the group consisting of silicon carbide, diamond, diamond-like carbon, amorphous carbon, carbon nitride and boron nitride. The support struts form and surround a plurality of discrete membrane areas of different sizes and aspect ratios aligned to design regions of an integrated circuit.

In a related aspect, the present invention provides a photolithography mask comprising a membrane layer, preferably of a material having a Young's modulus of at least about 400 GPa, and support struts supporting a surface of the membrane. The struts form and surround a plurality of discrete membrane areas of different aspect ratios aligned to design regions of an integrated circuit. There is also provided means for providing a contrasting image within the discrete membrane areas. The contrasting image means is used to expose the mask in a lithography process in patterns and corresponding to design elements within the integrated circuit design regions. Preferably, the discrete membrane areas have different aspect ratios which range from about 1:1 to about 12:1, and the discrete membrane areas have different size surface areas. The discrete membrane areas are free of support other than the surrounding support struts.

The membrane preferably comprises a material selected from the group consisting of silicon carbide, diamond, diamond-like carbon, amorphous carbon, carbon nitride and boron nitride. In one embodiment, the contrasting image means comprises patterned layers on a surface of the membrane within the discrete membrane areas corresponding to design elements within the integrated circuit design regions, with the patterned layers having a higher scattering of energy used to expose the mask in a lithography process than the membrane layer. In this embodiment, the membrane layer preferably has a thickness of about 50 to 150 nm at the discrete areas. In another embodiment, the contrasting image means comprises openings in a surface of the membrane within the discrete membrane areas corresponding to design elements within the integrated circuit design regions and permitting passage of energy, with the membrane layer having a higher absorption of energy used to expose the mask in a lithography process than the openings. In this other embodiment, the membrane layer preferably has a thickness of about 500 to 5000 nm at the discrete areas.

In another aspect, the present invention provides a photolithography mask comprising a membrane layer, preferably of a material having a Young's modulus of at least about 400 GPa, and support struts supporting a surface of the membrane, the struts forming and surrounding a plurality of discrete membrane areas each having a ratio of discrete membrane area to membrane thickness of at least about 0.18 $mm^2/nm$ and being aligned to design regions of an integrated circuit. Patterned layers on a surface of the membrane within the discrete membrane areas correspond to design elements within the integrated circuit design regions, with the patterned layers having a higher absorption of energy used to expose the mask in a lithography process than the membrane layer. In a further aspect, the present invention provides a photolithography mask comprising a membrane layer, preferably of a material having a Young's modulus of at least about 400 GPa, and support struts supporting a surface of the membrane, the struts forming and surrounding a plurality of discrete membrane areas each having a ratio of discrete membrane area to membrane thickness of at least about 1.0 $mm^2/nm$ and being aligned to design regions of an integrated circuit. Openings in a surface of the membrane within the discrete membrane areas correspond to design elements within the integrated circuit design regions and permitting passage of energy, the membrane layer having a higher absorption of energy used to expose the mask in a lithography process than the openings.

The present invention also relates to a photolithographic process for integrated circuits which comprises providing any of the aforementioned masks, sequentially striking discrete membrane areas of the mask with a charged particle beam and exposing a resist layer on a semiconductor wafer with portions of the energy beam which pass through the mask with design elements of an integrated circuit.

Yet another aspect of the present invention relates to a method of making a stencil mask for use in photolithographic processes comprising depositing a membrane film selected from the group consisting of diamond, diamond-like carbon and amorphous carbon on a substrate, and forming supporting struts on one side of the membrane film, with the struts forming and surrounding a plurality of discrete areas of the membrane film. The method then includes depositing a pattern over the membrane film within one or more of the discrete membrane film areas within the struts, the pattern conforming to one or more desired circuit elements, and etching the membrane film using the pattern to form openings in the membrane film. In this method the membrane film preferably comprises diamond film patterned with a hardmask layer. The method may further include depositing an etch stop layer adjacent the diamond film and etching the diamond film with a reactive ion etch containing oxygen.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 6 is a side elevational view of an ion or electron beam stencil mask made in accordance with the present invention.

DESCRIPTION OF THE PREFERRED EMBODIMENT(S)

Figure 1:
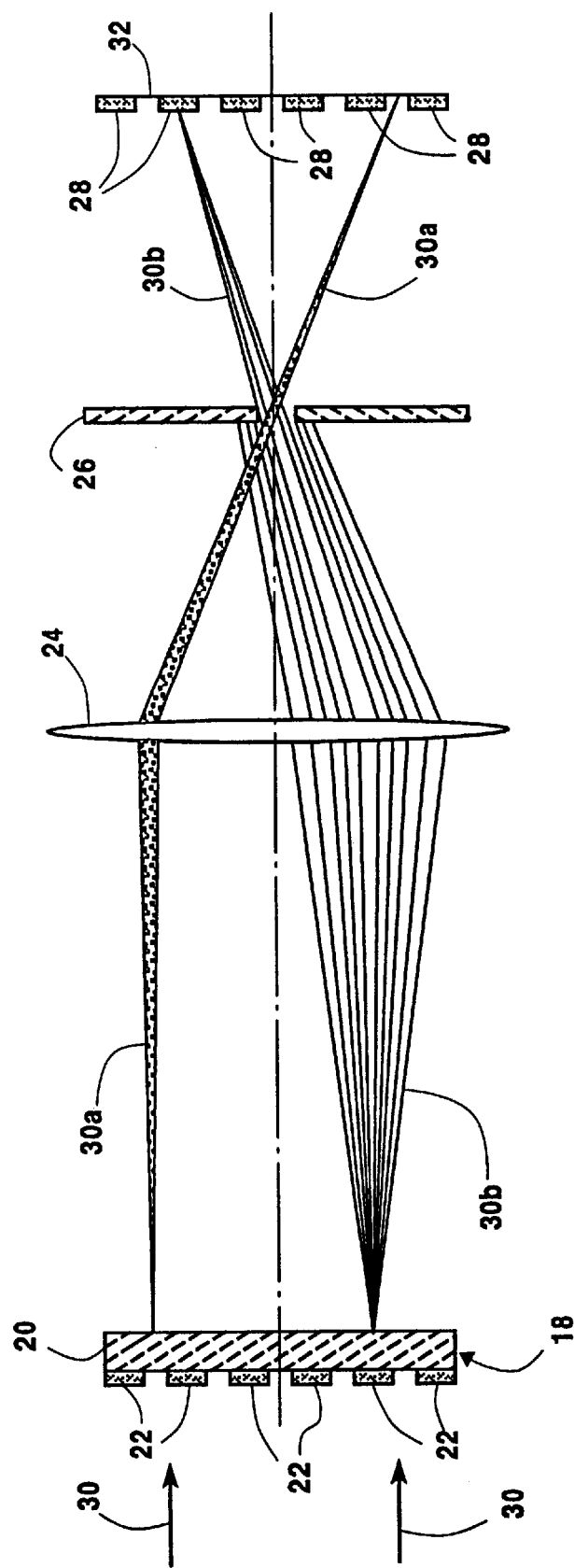
FIG. 1 is a schematic of the prior art PEBL process.
Figure 2:
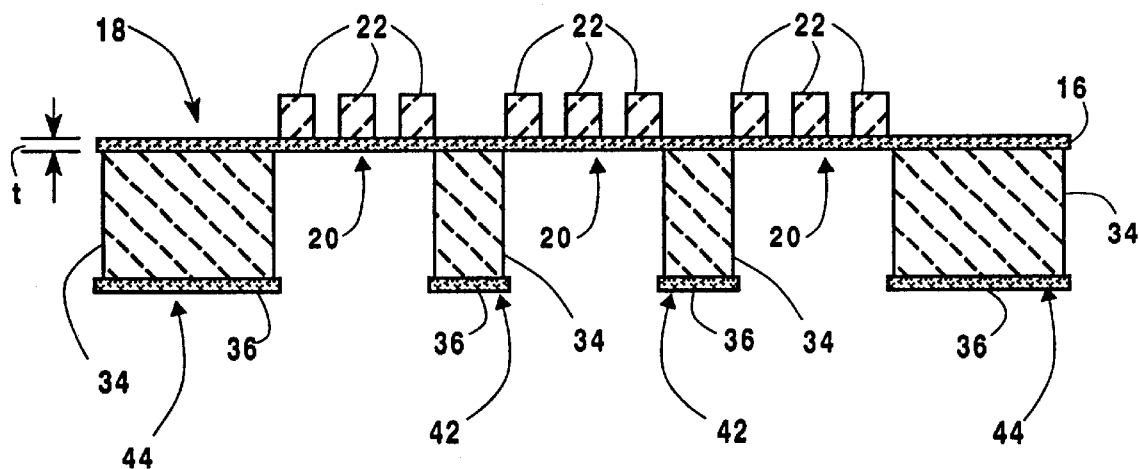
FIG. 2 is side elevational view of a prior art mask used in the PEBL process.
Figure 3:
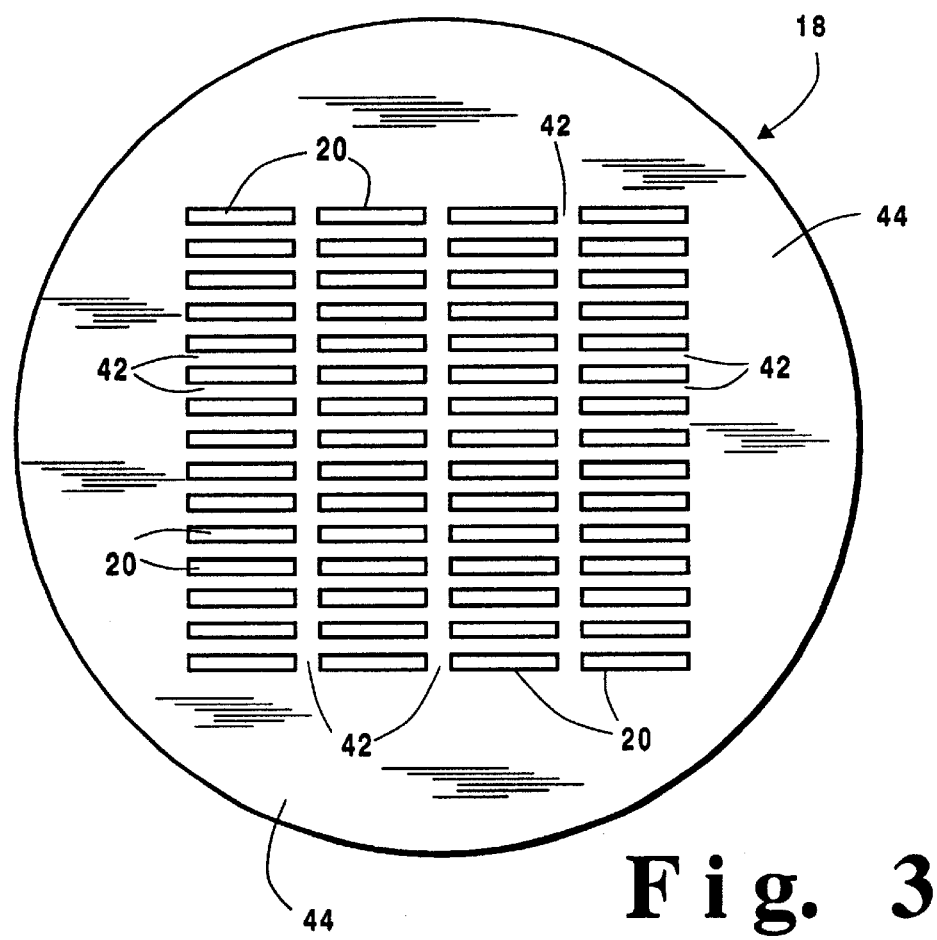
FIG. 3 is a bottom view of the prior art mask of FIG. 2.

In describing the preferred embodiment of the present invention, reference will be made herein to FIGS. 4–6 of the drawings in which like numerals refer to like features of the invention. Features of the invention are not necessarily shown to scale in the drawings.

Typical materials used in the past for membrane layers include doped-silicon and silicon-nitride (SiN). Such materials have a Young's modulus in the 160 GPa range. Instead of such conventional materials, the present invention uses other materials as PEBL mask membranes. Advanced materials, such as silicon carbide (SiC), diamond, and diamond-like carbon (DLC) have been found to have a more robust structure, which has been linked to their much higher Young's modulus of elasticity. The Young's modulus of diamond is approximately 1000 GPa, and the Young's modulus for SiC is about 480 GPa. The Young's modulus of DLC can vary depending on manufacturing, but can be made by conventional techniques with higher values. This means that, in order to provide the same mechanical stiffness as a 100 nm thick SiN membrane, a diamond membrane only 16 nm is theoretically required. Alternatively, a 100 nm thick diamond membrane will be six times stiffer than a SiN membrane of the same thickness. Preferably, the Young's modulus of the membrane material used in the present invention is at least about 150 GPa, more preferably at least about 400 GPa. Preferred membrane thickness is from about 20 to 300 nm, more preferably less than about 150 nm and in the range of about 50 to 150 nm.

Table 2 shows the unscattered electron transmission and Young's modulus of several candidate membrane materials. The electron transmission numbers were calculated from the electron scattering of the 100 keV electrons in a thickness of 100 nm. The Young's modulus of SiC and diamond is much higher than SiN. Therefore, a significant strength advantage can be gained by using SiC or diamond, without suffering a penalty in electron transmission. Diamond-like carbon is another preferred PEBL membrane material. It is also possible to optimize the electron transmission and/or Young's modulus of DLC for PEBL masks without undue experimentation.

TABLE 2

Electron Transmission and Young's Modulus of Membrane Materials

| Material | Transmission through 100 nm thickness (100 keV electrons) | Young's Modulus (GPa) |
| --- | --- | --- |
| SiN | 15.3% | 160 |
| Si | 20.7% | 160 |
| SiC | 16.4% | 480 |
| Diamond | 16.6% | 1000 |
| DLC | 26.1% (varied) | 400–800 |
| Amorphous Carbon | ~26% | 680 |

There are several advantages gained by making a PEBL mask using one of these stronger membrane materials. Firstly, the entire mask structure is stronger, more robust, and more resistant to breakage. Because of the stronger membrane, less supporting silicon struts are required. This increases available mask real estate or working area, and reduces complications that arise from breaking up the circuit pattern into several smaller membranes.

Figure 4:
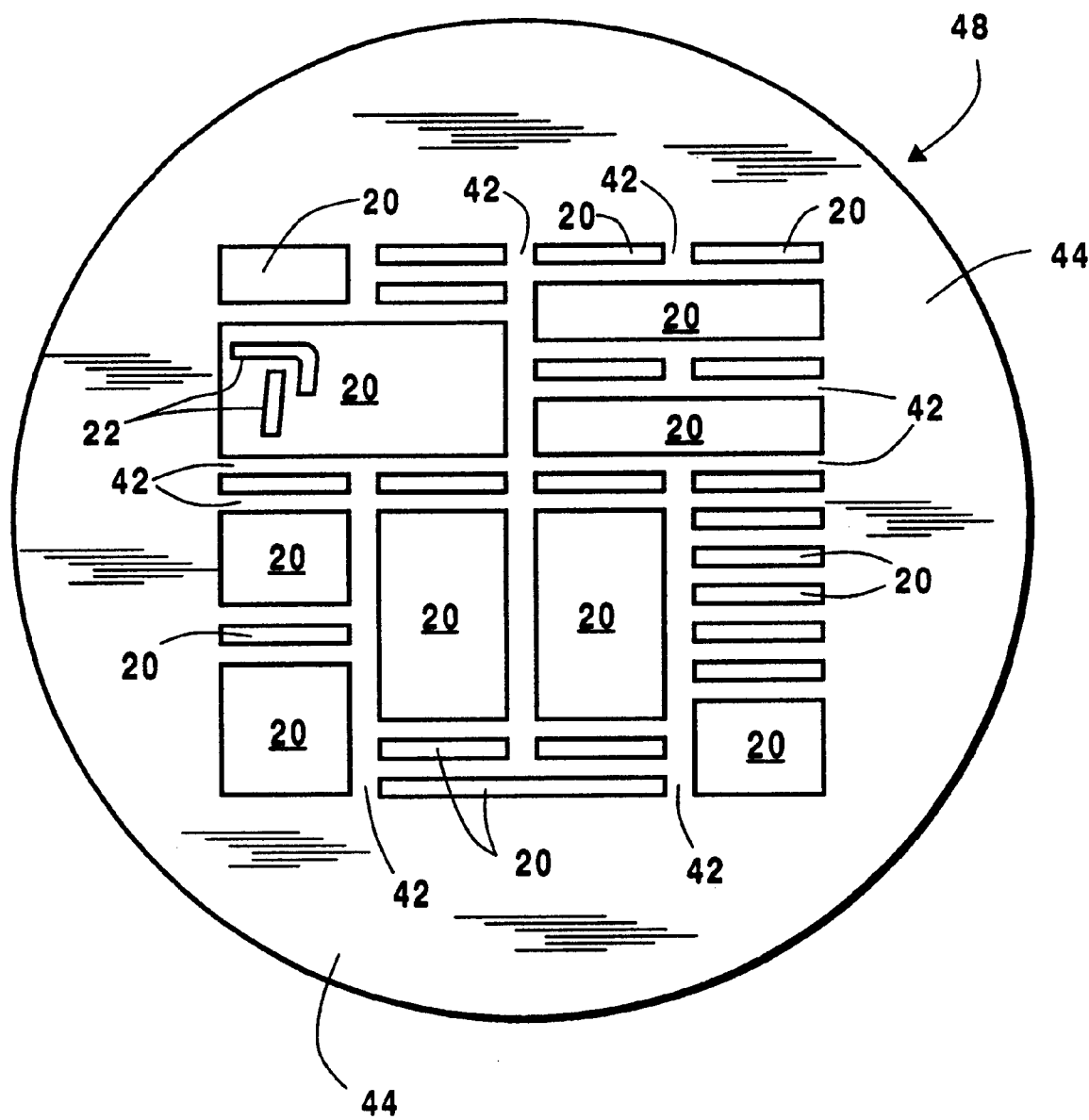
FIG. 4 is a bottom view of a photolithography mask made in accordance with the present invention.
Figure 5:
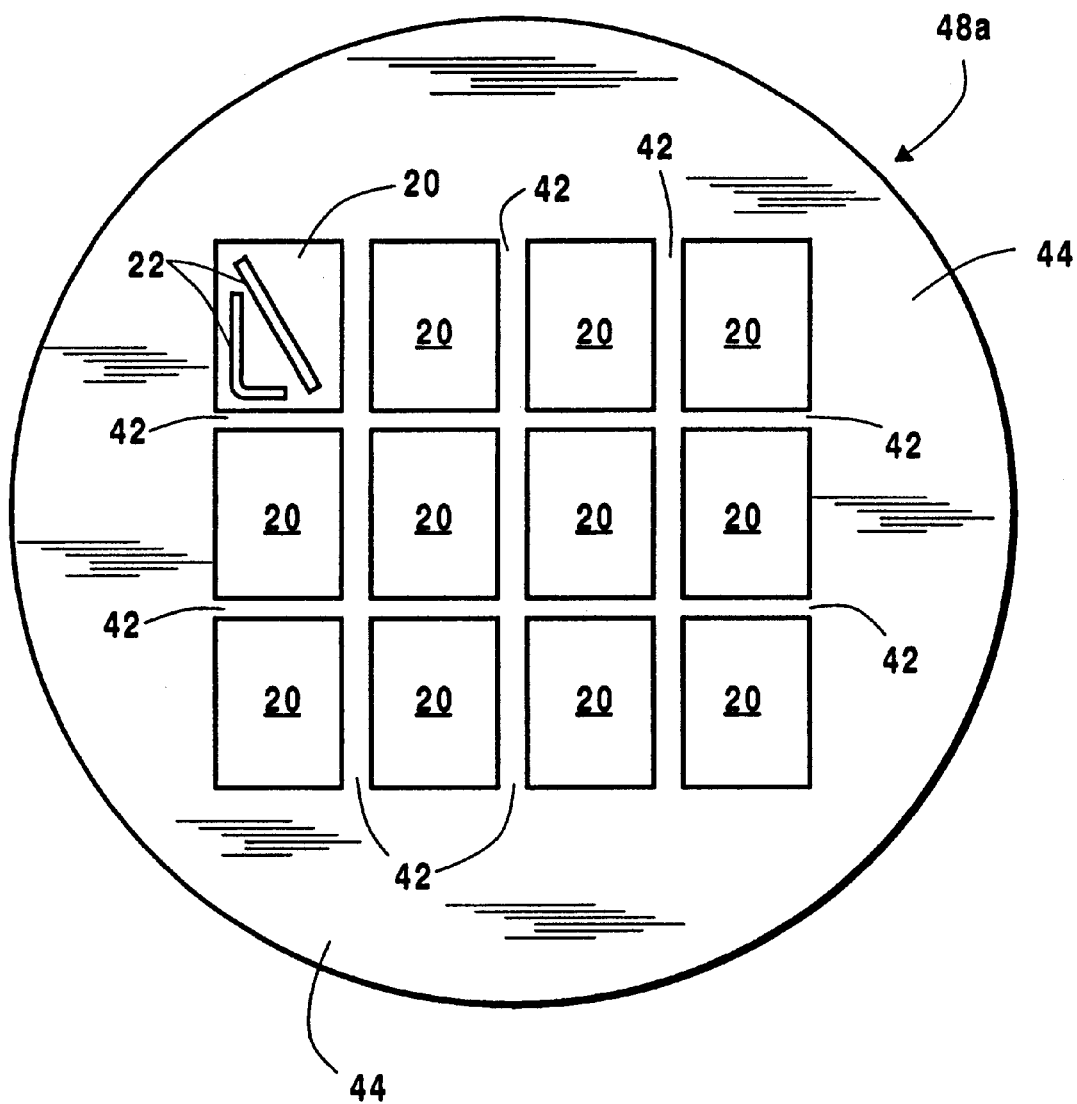
FIG. 5 is a bottom view of another photolithography mask made in accordance with the present invention.

In accordance with the present invention it is possible to customize the arrangement of membranes and struts to match the chip design, as shown in FIG. 4. Mask 48 made in accordance with the present invention has an outer peripheral circular or ring-shaped support region 44 which supports an outer portion of membrane layer 16. An inner membrane region has a plurality of open membrane-exposed areas 20 between struts 42 of varying size and aspect ratio. Typical aspect ratios on the same mask may vary from about 1:1 to about 12:1 (width:length) as seen in plan view. Circuit pattern areas that are less critical and/or have less coverage by scatterer layers 22 are written on larger membranes by methods known to those skilled in this art, and smaller membranes may be reserved for scatterer layers 22 projecting high pattern density regions where more support is needed. In another embodiment shown in FIG. 5, in mask 48a the open membrane areas 20 are all of the same area and aspect ratio, but the area of each of the discrete areas 20 is considerably larger than is permitted in the known prior art for the membrane 16 layer thickness employed. The ratio of discrete membrane area (in $mm^2$) to membrane thickness (in nm) in scatterer masks made in accordance with the present invention is at least about 0.18 $mm^2$/nm, more preferably at least about 0.20 or 0.25 $mm^2$/nm. Such scatterer masks when used in charged particle beam photolithography such as SCALPEL™ will have a membrane thickness no more than about 150 nm, and in the range of about 50–150 nm, preferably no more than about 75 or 100 nm. An example is a silicon nitride ($SiN_x$) membrane of thickness 75 nm and discrete membrane area of 13 $mm^2$. Scatterer layers 22 are again written on the membrane areas to project the desired circuit pattern features or elements as a result of the charged particle absorption contrast between the material of layers 22 and the membrane 16 material. The preferred scatterer layer materials are those discussed previously. In both embodiments, more usable mask area results.

In yet another embodiment, the membrane materials of the present invention may also be used as stencil masks for charged particle lithography such as PEBL. As shown in mask 48b in FIG. 6, instead of having a separate scatterer layer deposited on membrane layer 16 to project the features or elements of the desired circuit pattern, open membrane areas 20 contains openings 50 formed therein in the pattern of these circuit features. While the preferred membrane materials of the present invention are sufficiently transparent to electron transmission so that a contrast is provided against the scatterer layer materials in the embodiments in FIGS. 4 and 5, the same membrane as used in a thicker configuration in the embodiment of FIG. 6 always has a certain degree of scatter which contrasts with the absence of any material in openings 50. Thus the pattern of openings 50 permit unimpeded transmission of an electron or other charged particle beam, compared to the low, but ever-present scattering through membrane material 16, which now acts as the absorber layer because it is thicker, e.g., about 2000 nm. No separate absorber layer is needed since the absorption of the charged particle beam by the membrane provides sufficient contrast with the essentially unimpeded transmission properties of the openings 50. Such a stencil pattern of openings 50 may be exposed on a suitable resist on a wafer, i.e., a resist of the type opposite to that used for the masks of FIGS. 4 and 5. Again, open membrane areas 20, supported by struts 42, area able to be made considerable larger and in varying aspect ratios, as shown in the embodiments of FIGS. 4 and 5, as compared to the prior art.

The preferred membrane material for the stencil mask of the type shown in FIG. 6 is diamond. When diamond is used as the membrane, the preferred process of making the mask is as follows. Initially, a layer or film of diamond of about 500 to 5000 nm thickness is deposited by well-known methods on a substrate of, for example, silicon. Before depositing the diamond layer, it is preferred that an etch stop layer be deposited such as a silicon-on-insulator (SOI) wafer having a thin (e.g., less than 100 nm) layer of silicon on the buried oxide. The diamond film is then patterned by depositing thereover a suitable resist and, optionally, a hardmask material in the configuration of the circuit elements. The hardmask is preferably a layer of SiON, $Si_3N_4$, or $SiO_2$. The resist and/or hardmask material is then used to selectively etch away the diamond membrane layer down to the underlying substrate. Etching high aspect ratio features with good pattern fidelity is possible using organic etchants. Good results have been achieved using low pressure reactive ion etching containing oxygen, e.g., an $O_2/N_2$ plasma etch, with a SiON hardmask layer. Optionally, additives such as CO, $CO_2$ or hydrocarbons may be employed in the etching of the diamond layer, and selectively to the underlying substrate is usually very high. After the diamond pattern etching, the supporting struts and other supporting structure are formed and the intermediate oxide and silicon layers are removed, which results in the diamond membrane having free upper and lower surfaces, as shown in FIG. 6. Optionally, the supporting struts and other structure may be formed before patterning and/or etching the openings in the diamond film.

Although diamond is the preferred membrane film material for the stencil mask of the present invention, other membrane materials such as SiC, DLC and amorphous carbon may be employed. The ratio of discrete membrane area (in $mm^2$) to membrane thickness (in nm) in stencil masks made in accordance with the present invention is at least about 1.0 $mm^2$/nm, more preferably at least about 1.5 $mm^2$/nm. Such stencil masks when used in PEBL photolithography will have a membrane thickness in the range of about 500 to 5000 nm.

The different mask embodiments 48, 48a, 48b of the present invention may be employed in charged particle lithography in the manner analogous to that described in the connection with FIG. 1. Although the mask of the present invention is also useful in x-ray lithography, it is preferably employed in charged particle lithography such as electron beam lithography where a focused beam is sequentially stepped over particular regions of the mask to expose one discrete membrane area or feature at a time. Regardless of which means for providing a contrasting image is used, i.e., the separate scatterer layer over the membrane or the openings in the membrane itself, in the mask of the present invention, it is therefore possible and advantageous to arrange the membranes so that stitching across complicated circuit features is avoided. Another important advantage of using stronger membrane materials is related to image placement error. A stronger membrane mask is more forgiving to any residual film stress in the scatterer layer, thereby resulting in less image placement distortions from patterning. Another advantage of using the preferred membrane materials of the present invention is improved thermal properties. The higher thermal conductivity offered by these materials, especially diamond, reduces mask heating effects during processing and exposure, and thus can reduce distortions further.

The electron transmission and Young's modulus are two important parameters of membrane mask substrate materials useful in the present invention, but there are also other material characteristics that are preferably met. The ideal membrane film will be deposited in such a way that it is continuous, and does not have any pinholes at the desired thickness, i.e. 100–150 nm. The surface roughness of the membrane film is preferably less than 1 nm to enable sputter deposition of low stress scatterer films. The film stress of the membrane material is preferably tensile in the 100–300 Mpa range. If the stress is lower than this, compressive membranes will result, and if the stress is much higher, there will be membrane yield issues. Since the membranes are so thin, thickness uniformity is also an important issue, and, as an example, thickness variation is preferably less than 5% across the mask. Materials that meet all of these characteristics would be the most preferred choice as the substrate for projection electron-beam lithography masks. For masks using scatterer layers, the membrane material more preferably has an atomic number less than about 10.

As provided in the lithographic mask of the present invention, stronger membrane materials such as diamond, silicon carbide (SiC), diamond-like carbon (DLC), amorphous carbon, carbon nitride ($C_3N_4$), and boron nitride (BN) offer significant advantages over a Si and SiN membrane material. Accordingly, the membrane areas may be made of varying aspect ratio and size to conform to circuit patterns of different pattern density and feature size. Thus, the mask of the present invention is not subject to the limitations of uniform size and aspect ratio between mask supporting struts as in the prior art. More freedom in circuit design and less mask breakage are the primary results.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A mask for photolithographic transfer of an image corresponding to an integrated circuit from said mask onto a semiconductor substrate comprising:

a patterned scattering or absorbing layer on a top surface of a partially energy transparent membrane in an inner region of said membrane;

a peripheral support ring supporting an outer region of said membrane; and support struts supporting said inner region of said membrane, said struts connected to said support ring and aligned to major design elements of said integrated circuit.

2. The mask of claim 1 wherein said membrane is formed of a material having a Young's modulus of at least about 400 GPa.

3. The mask of claim 1 wherein said membrane comprises material selected from the group consisting of silicon carbide, diamond, diamond-like carbon, amorphous carbon, carbon nitride and boron nitride.

4. The mask of claim 1 wherein said support struts form and surround a plurality of discrete membrane areas of different sizes and aspect ratios aligned to design regions of an integrated circuit.

5. A photolithography mask comprising:

a membrane layer;

support struts supporting a surface of said membrane, said struts forming and surrounding a plurality of discrete membrane areas of different aspect ratios aligned to design regions of an integrated circuit; and means for providing a contrasting image within said discrete membrane areas, the contrasting image means being used to expose said mask in a lithography process in patterns and corresponding to design elements within the integrated circuit design regions.

6. The mask of claim 5 wherein said membrane layer has a Young's modulus of at least about 400 GPa.

7. The mask of claim 5 wherein said discrete membrane areas have different aspect ratios range from about 1:1 to about 12:1.

8. The mask of claim 5 wherein said discrete membrane areas have different size surface areas.

9. The mask of claim 5 wherein said discrete membrane areas are free of support other than the surrounding support struts.

10. The mask of claim 5 wherein said membrane comprises a material selected from the group consisting of silicon carbide, diamond, diamond-like carbon, amorphous carbon, carbon nitride and boron nitride.

11. The mask of claim 5 wherein the contrasting image means comprises patterned layers on a surface of said membrane within said discrete membrane areas corresponding to design elements within the integrated circuit design regions, said patterned layers having a higher scattering of energy used to expose said mask in a lithography process than said membrane layer.

12. The mask of claim 11 wherein said membrane layer has a thickness of about 50 to 150 nm at the discrete areas.

13. The mask of claim 11 wherein said membrane comprises a material selected from the group consisting of silicon carbide, diamond, diamond-like carbon, amorphous carbon, carbon nitride and boron nitride.

14. The mask of claim 5 wherein the contrasting image means comprises openings in a surface of said membrane within said discrete membrane areas corresponding to design elements within the integrated circuit design regions and permitting passage of energy, said membrane layer having a higher absorption of energy used to expose said mask in a lithography process than said openings.

15. The mask of claim 14 wherein said membrane layer has a thickness of about 500 to 5000 nm at the discrete areas.

16. The mask of claim 14 wherein said membrane comprises a material selected from the group consisting of silicon carbide, diamond, diamond-like carbon, amorphous carbon, carbon nitride and boron nitride.

17. A photolithography mask comprising:
   a membrane layer;
   support struts supporting a surface of said membrane, said struts forming and surrounding a plurality of discrete membrane areas each having a ratio of discrete membrane area to membrane thickness of at least about 0.18 mm$^2$/nm and being aligned to design regions of an integrated circuit; and
   patterned layers on a surface of said membrane within said discrete membrane areas corresponding to design elements within the integrated circuit design regions, said patterned layers having a higher absorption of energy used to expose said mask in a lithography process than said membrane layer.

18. The mask of claim 17 wherein said membrane layer has a Young's modulus of at least about 400 GPa.

19. A photolithography mask comprising:
   a membrane layer;
   support struts supporting a surface of said membrane, said struts forming and surrounding a plurality of discrete membrane areas each having a ratio of discrete membrane area to membrane thickness of at least about 1.0 mm$^2$/nm and being aligned to design regions of an integrated circuit; and
   openings in a surface of said membrane within said discrete membrane areas corresponding to design elements within the integrated circuit design regions and permitting passage of energy, said membrane layer having a higher absorption of energy used to expose said mask in a lithography process than said openings.

20. The mask of claim 19 wherein said membrane layer has a Young's modulus of at least about 400 GPa.

21. A photolithographic process for integrated circuits comprising providing the mask of claim 1, sequentially striking discrete membrane areas of said mask with a charged particle beam and exposing a resist layer on a semiconductor wafer with portions of the energy beam which pass through said mask with design elements of an integrated circuit.

22. A method of making a stencil mask for use in photolithographic processes comprising:
   depositing a membrane film selected from the group consisting of diamond, diamond-like carbon and amorphous carbon on a substrate;
   forming supporting struts on one side of said membrane film, said struts forming and surrounding a plurality of discrete areas of said membrane film;
   depositing a pattern over said membrane film within one or more of the discrete membrane film areas within said struts, said pattern conforming to one or more desired circuit elements; and
   etching the membrane film using said pattern to form openings in said membrane film.

23. The method of claim 22 wherein said membrane film comprises diamond film and further including depositing an etch stop layer adjacent the diamond film.

24. The method of claim 22 wherein said membrane film comprises diamond film and said diamond film is patterned with a hardmask layer.

25. The method of claim 22 wherein said membrane film comprises diamond film and said diamond film is etched with a reactive ion etch containing oxygen.

* * * * *